(12) United States Patent
Ma et al.

(10) Patent No.: US 6,570,258 B2
(45) Date of Patent: *May 27, 2003

(54) METHOD FOR REDUCING CAPACITIVE COUPLING BETWEEN CONDUCTIVE LINES

(75) Inventors: Kin F. Ma, Boise, ID (US); Eric T. Stubbs, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/884,630

(22) Filed: Jun. 18, 2001

(65) Prior Publication Data

US 2001/0028112 A1 Oct. 11, 2001

Related U.S. Application Data

(63) Continuation of application No. 09/150,628, filed on Sep. 9, 1998, now Pat. No. 6,259,162, which is a continuation of application No. 08/641,154, filed on Apr. 29, 1996, now Pat. No. 5,854,128.

(51) Int. Cl.[7] .......................... H01L 29/40; H01L 23/48; H01L 27/108
(52) U.S. Cl. .................. 257/774; 257/208; 257/758; 257/773; 257/776; 257/907
(58) Field of Search ................. 257/208, 621, 257/758, 774, 776, 907, 908; 438/622, 637, 638, 625, 631, 667

(56) References Cited

U.S. PATENT DOCUMENTS

| | | | | |
|---|---|---|---|---|
| 3,945,347 A | | 3/1976 | Takemoto et al. | 438/631 |
| 4,497,890 A | | 2/1985 | Helbert | 438/669 |
| 4,585,515 A | | 4/1986 | Ma | 438/664 |
| 4,666,553 A | * | 5/1987 | Blumenfeld et al. | 156/643 |
| 4,789,648 A | | 12/1988 | Chow et al. | 438/637 |
| 4,801,554 A | | 1/1989 | Gobrecht et al. | 438/666 |
| 4,933,303 A | | 6/1990 | Mo | 438/631 |
| 4,953,125 A | * | 8/1990 | Okumura et al. | 365/149 |
| 5,108,943 A | | 4/1992 | Sandhu et al. | 437/52 |
| 5,266,521 A | | 11/1993 | Lee et al. | 438/653 |
| 5,346,587 A | | 9/1994 | Doan et al. | 438/592 |
| 5,397,908 A | | 3/1995 | Dennison et al. | 257/306 |
| 5,498,562 A | | 3/1996 | Dennison et al. | 437/52 |
| 5,529,955 A | | 6/1996 | Hibino et al. | 438/683 |
| 5,561,082 A | | 10/1996 | Matsuo et al. | 438/396 |
| 5,627,094 A | | 5/1997 | Chan et al. | 438/396 |
| 5,693,568 A | * | 12/1997 | Liu et al. | 437/195 |
| 5,846,876 A | * | 12/1998 | Bandyopadhyay et al. | 438/622 |
| 5,854,128 A | | 12/1998 | Ma et al. | 438/631 |
| 6,259,162 B1 | * | 7/2001 | Ma et al. | 257/774 |

FOREIGN PATENT DOCUMENTS

JP    63-127565    *    5/1988    ........... H01L/27/10

* cited by examiner

Primary Examiner—Tom Thomas
Assistant Examiner—Ori Nadav

(57) ABSTRACT

An embodiment of the present invention discloses a memory device having an array with digit lines arranged in complementary pairs, the array comprising; a substantially planar layer having trenches therein; a first level of digit lines residing at least partially in the trenches; a second level of digit lines residing on the surface of the layer, the second level extending in generally parallel relation to the digit lines in the first level. The first level of digit lines are in alternating positions with the second level of digit lines and the alternating positions comprise a repeating pattern of a first complementary pair of digit lines at the first level adjacent a second complementary pair of digit lines at the second level.

9 Claims, 2 Drawing Sheets

US 6,570,258 B2

METHOD FOR REDUCING CAPACITIVE COUPLING BETWEEN CONDUCTIVE LINES

This application is a continuation to U.S. patent application No. 09/150,628, filed Sep. 9, 1998 now U.S. Pat. No. 6,259,162 which is a continuation Ser. No. 08/641,154 to U.S. Pat. No. 5,854,128, filed Apr. 29, 1996.

FIELD OF THE INVENTION

This invention relates to conductive lines for semiconductor devices and particularly to metal lines for semiconductor memory devices.

BACKGROUND OF THE INVENTION

In semiconductor devices, conductive lines are used to interconnect between various devices or circuitry and or both. For example, power buses are typically made of a metal that is capable of carrying the required current necessary to operate the device.

In a semiconductor memory device, besides metal power buses, the memory array is interconnected by a grid of column (digit or bit) and row (word) lines. The word lines are typically made of polysilicon, topped with a metal silicide, while the bit lines comprise some form of metal.

The bit lines, in a memory array, run basically perpendicular to the word lines and in a parallel fashion to one another. A common characteristic between neighboring bit lines is the capacitive coupling that exists. Digit lines need to be at a specific precharge voltage in order to be read correctly during memory cell sensing. Since there is a capacitive coupling component between neighboring conductors, when a neighboring line is pulled high or low it can couple a digit line above or below the precharge voltage, thus affecting the device's ability to sense data correctly. As memory arrays become denser, the bit lines are crowded even closer together which in turn will increase the capacitive coupling.

It is desirable to reduce the capacitive coupling between conductive lines and in particular between neighboring bits lines of a memory array in order to provide a more efficient array. The present invention discloses a conductive line arrangement that may be used in any semiconductor device that uses substantially parallel conductors, such as in the memory array or a memory device, or the like, that indeed reduces capacitive coupling between neighboring lines (i.e., neighboring bits lines in a memory array).

SUMMARY OF THE INVENTION

A general embodiment of the present invention discloses a semiconductor device having conductive lines, where a first portion of the conductive lines are at a first level and a second portion of the conductive lines are at a second, vertically offset level to the first level, the second level extending in generally parallel relation to the first level.

A method to form the above structure comprises the steps of:
  forming a first portion of the conductive lines at a first level; forming a second portion of the conductive lines at a second, vertically offset level to the first level;
  wherein the second level extends in generally parallel relation to the first level.

Another embodiment discloses a two level conductive structure fabricated in a semiconductor device, the structure comprising;
  a suitable layer having trenches therein; a first level of conductive lines residing at least partially in the trenches; a second level of conductive lines, the second level of conductive lines having a major portion protruding above the surface of the layer and extending in generally parallel relation to the first level of conductive lines.

A method to form the two level conductive structure above comprises the steps of:
  forming a plurality of trenches in a suitable layer; forming a conductive layer over the suitable layer, thereby at least partially filling the trenches;
  patterning the conductive layer to form a first and second level of conductive lines vertically offset from one another.

DETAILED DESCRIPTION OF THE INVENTION

A first embodiment of the present invention of singe alternating conductive lines, vertically offset from one another, is depicted in FIGS. 1–4.

Figure 1:
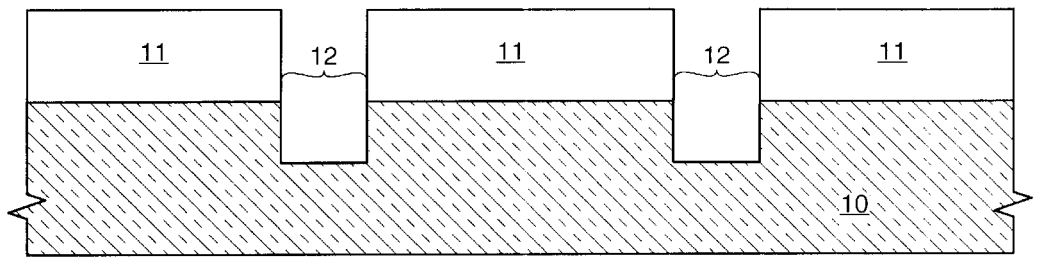
FIGS. 1–4 depict exemplary process steps in an implementation of the invention to form single alternating conductive lines in accordance with the present invention (as shown in FIG. 4)

FIG. 1, shows the process stage of a wafer with the beginning steps to form a plurality of conductive lines for a semiconductor device. First a substantially planar layer 10 is patterned using patterning material 11 (such as photoresist) and etched to form a plurality of trenches 12 in the planar layer. Though it is not necessary that layer 10 be substantially planar it is highly desirable which will become evident as discussed later in the process. Also, layer 10 may be made up of an insulating material such as an oxide, a silicon material or any suitable material a particular process may use to construct the structure of the present invention. If a material other than an insulator is used to form layer 10, then some type of conformal insulator should be formed over layer 10 after patterning material 11 is removed and prior to forming a conductive layer over layer 10.

Figure 2:
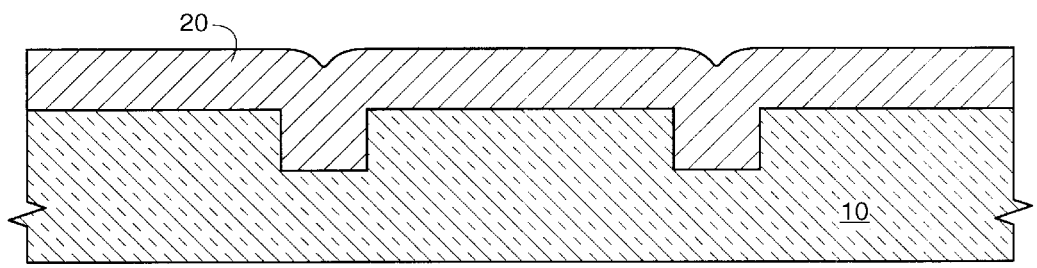

Referring now to FIG. 2, patterning material 11 shown in FIG. 1 is removed and a conductive layer 20 is formed over the surface of layer 10, which at least partially fills trenches 12. For example, conductive layer 20 may be a sputtered aluminum.

Figure 3:
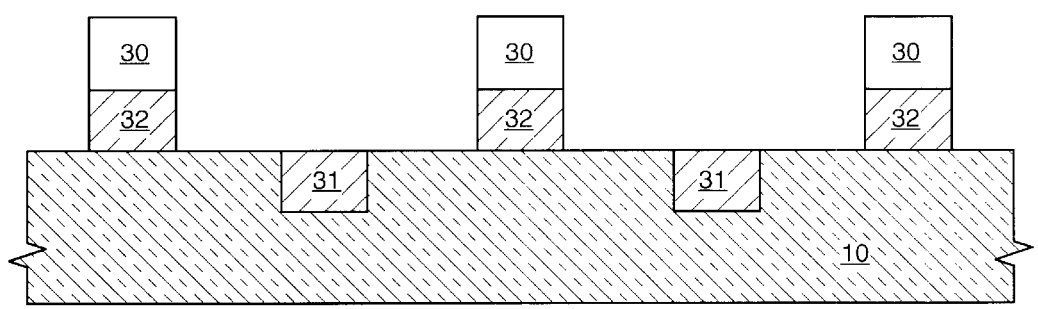

Referring now to FIG. 3, patterning material 30 is formed so that a subsequent etch creates a plurality of conductive lines with a single conductive line 31 formed in each trench 12 and conductive lines 32 formed on the surface of layer 10 where a major portion of each conductive line 32 protrudes above the surface of layer 10.

Figure 4:
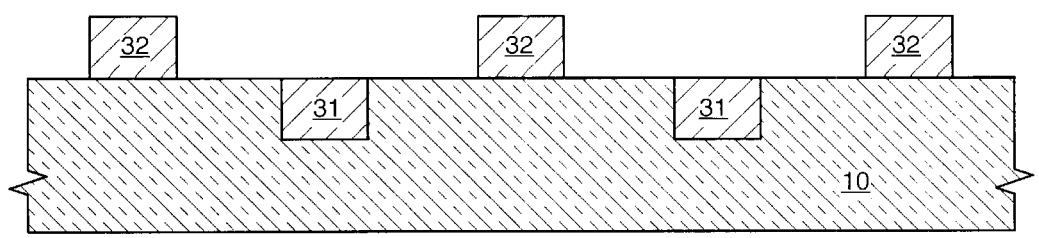

As FIG. 4 shows, patterning material 30 (seen in FIG. 3) has been removed, leaving behind conductive lines 31 and 32 aged in an alternating pattern This arrangement of conductive lines may be a recurring pattern of alternating conductive lines. The alternating arrangement helps to reduce capacitive coupling between neighboring conductive lines, since capacitance is proportional to the parallel coupling area between lines 31 and 32. In order to gain the benefit of the reduced capacitive coupling it is important that the conductive lines formed in the trenches are residing at least partially in the trenches. The conductive lines formed on the surface of layer 10 extend in a generally parallel relation to the conductive lines formed at least partially in the trenches.

A second embodiment of the present invention of double alternating conductive lines vertically offset from one another is depicted in FIGS. 5–8.

Figure 5:
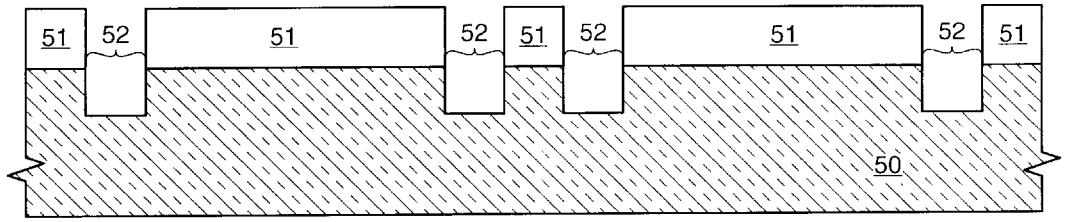
FIGS. 5–8 depict exemplary process steps in an implementation of the invention to form double alternating conductive lines in accordance with the present invention (as shown in FIG. 8).

FIG. 5, shows the process stage of a wafer at which the beginning steps to form double conductive lines for a semiconductor device are integrated. First, a substantially planar layer 50 is patterned using patterning material 51 (such as photoresist) and etched to form a plurality of trenches 52 in the planar layer. As in the first embodiment, though it is not necessary that layer 50 be substantially planar it is highly desirable as will be discussed later in the process. Also, layer 50 may be made up of an insulating material, a silicon material or any suitable material a particular process may use to construct the structure of the present invention. If a material other than an insulator is used to form layer 50, then some type of conformal insulator should be formed over layer 50 after patterning material 51 is removed and prior to forming a conductive layer over layer 50.

Figure 6:
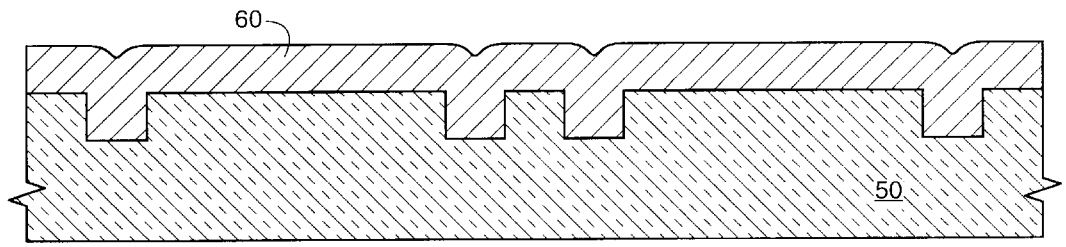

Referring now to FIG. 6, patterning material 51 (shown in FIG. 5) is removed and a conductive layer 60 is formed over the surface of layer 50, which at least partially fills trenches 52. For example, conductive layer 60 may be a sputtered aluminum.

Figure 7:
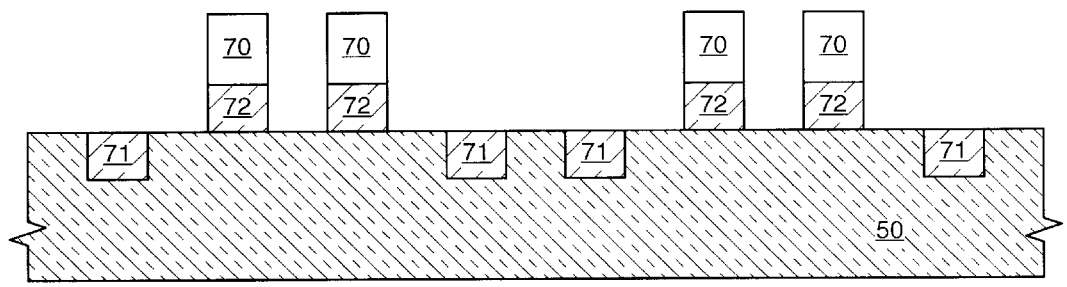

Referring now to FIG. 7, patterning material 70 (such as photoresist) is formed so that a subsequent etch creates a plurality of conductive lines with a first set of single conductive lines 71, each single conductive line formed in an individual trench 52 and a second set of conductive lines 72 formed on the surface of layer 50.

Figure 8:
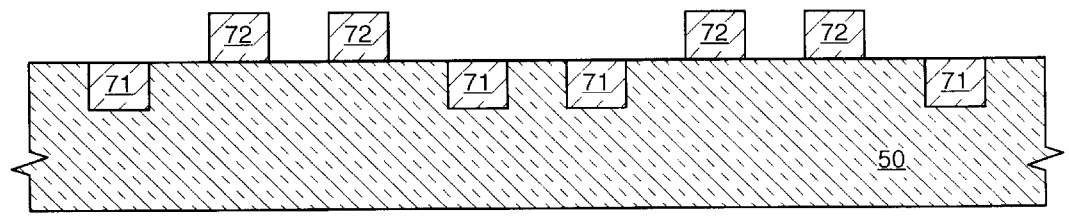

As FIG. 8 shows the patterning material 70 (seen in FIG. 7) has been removed, leaving behind conductive lines 71 and 72 arranged in an alternating pattern. This arrangement of conductive lines may be a reoccurring pattern of alternating conductive lines. This alternating arrangement helps to reduce capacitive coupling between neighboring conductive lines. In order to gain the benefit of the reduced capacitive coupling it is important that the conductive lines formed in the trenches are residing at least partially in the trenches. The conductive lines formed on the surface of layer 50 extend in generally parallel relation to the conductive lines formed at least partially in the trenches.

In the embodiments described above, the generally parallel relationship between the conductive lines is intended to include conductive lines oriented such that they travel in basically the same direction in the semiconductor device. The lines may follow each others' contour in the strict sense of being parallel or, for example, as in the case of a memory device, the conductive lines (the digit lines) extend in the same direction and yet they may bow away from each other for a distance and then come back together. Furthermore, the generally parallel relationship is also intended to include twisted neighboring digits lines. In light of the present invention, the digit line on the surface of the layer (either 10 or 50) may at some point cross over a trench embedded digit line. Then it may run along side the trench, cross back over the trench embedded digit line and once again run along side the trench. (This pattern may or may not repeat depending on the desired layout.)

In a specific application of the present invention, conductive lines make up the digit lines of a semiconductor memory device, such as a dynamic random access memory device.

Typically, digit lines in this type of application are made from metal, so in order to avoid problems associated with metals, such as poor step coverage or electromigration, it is highly desirable to form the metal lines on a substantially planar surface. Each digit line will have a complementary digit line as its neighbor (also referred to as complementary pairs).

In one embodiment the complementary pairs are arranged so that one leg of the complementary pair is at least partially embedded in an insulating layer and the other leg resides on the surface of the insulating layer.

Data is sensed by comparing two digit lines (or complementary pairs). If the two digit lines in a complementary pair have different characteristics (i.e., the way they are formed, how they are oriented to their nearest neighbor, etc.) the pair will be inherently unbalanced. This could lead to one digit line being more prone to failure (incorrect data sensing) than the other digit line in the pair. In a second embodiment the complementary pairs are arranged so that both legs of a first pair are at least partially embedded in an insulating layer and both legs of the second pair reside on the surface of the insulating layer. In this case, the complementary pairs are more evenly matched to avoid the problems mentioned above of an unbalanced complementary pair.

Whichever structure is being formed, the formations of either of these embodiments is taught such that a single conductive layer (i.e., metal for digit lines, such as a sputter aluminum) is used to form conductive lines at two different levels on the semiconductor device. Also, though the embodiments teach single alternating and double alternating conductive lines, the principles taught will allow one to construct triple, quadruple, etc., alternating sets of conductive lines, though the benefit of reduced capacitive coupling between the conductive lines will diminish as the number increases.

It is to be understood that although the present invention has been described with reference to several preferred embodiments, various modifications, known to those skilled in the art may be made to the process steps presented herein without departing from the invention as recited in the several claims appended hereto.

What is claimed is:

1. A two level conductive structure in a semiconductor device, said structure comprising:
    an insulation layer having a top surface, said top surface establishing a reference plane;
    first level conductive lines residing in said insulation layer and lying below said reference plane while being in contact therewith;
    second level conductive lines lying above said reference plane while being in contact therewith, said second level conductive lines being laterally offset from said first level conductive lines such that no conductive line of said second level makes contact to any conductive line of said first level, wherein said first level conductive lines and said second level conductive lines comprise digit lines of a semiconductor memory device.

2. The two level conductive structure of claim 1, wherein said first level conductive lines are in alternating positions with said second level conductive lines.

3. The two level conductive structure of claim 2, wherein said alternating positions comprise a repeating pattern of at least one conductive line of said first level conductive lines residing adjacent at least one conductive line of said second level conductive lines.

4. The two level conductive structure of claim 2, wherein said alternating positions comprise a repeating pattern of a pair of conductive lines of said first level conductive lines residing adjacent a pair of conductive lines of said second level conductive lines.

5. The two level conductive structure of claim 1, wherein said first level conductive lines and said second level conductive lines comprise metal.

6. A memory device having digit lines with a first portion of said digit lines at a first level lying above and making contact with a reference plane defined by a top surface of an insulation material and a second portion of said digit lines at a second level lying below and making contact with said reference plane, said second level being laterally offset from said first level and extending in generally parallel relation thereto; wherein, none of said digit lines of said second level directly underlies any of said digit lines of said first level.

7. The memory device of claim 6, wherein complementary pairs of digit lines comprise a digit line from said first portion and a digit line from said second portion in a repeating pattern.

8. The memory device of claim 6, wherein said semiconductor memory device comprises a dynamic random access memory device.

9. The memory device of claim 6, wherein said conductive lines comprise metal.

* * * * *

UNITED STATES PATENT AND TRADEMARK OFFICE
CERTIFICATE OF CORRECTION

PATENT NO.     : 6,570,258 B2                                           Page 1 of 1
DATED          : May 27, 2003
INVENTOR(S)    : Ma et al.

It is certified that error appears in the above-identified patent and that said Letters Patent is hereby corrected as shown below:

<u>Column 2,</u>
Line 29, please replace "present invention of singe" with -- present invention of single --
Line 40, please replace "an insulating material such as" with -- an insulating material, such as --
Line 60, please replace "32 aged in an alternating pattern" with -- 32 arranged in an alternating pattern. --

Signed and Sealed this

Twenty-fifth Day of November, 2003

JAMES E. ROGAN
*Director of the United States Patent and Trademark Office*